United States Patent [19]

Gross

[11] 4,032,836

[45] June 28, 1977

[54] TRANSFORMER CIRCUIT

[75] Inventor: Thomas A. O. Gross, Lincoln, Mass.

[73] Assignee: The Gillette Company, Boston, Mass.

[22] Filed: Nov. 28, 1975

[21] Appl. No.: 636,108

[52] U.S. Cl. .................................. 323/6; 323/60; 333/81 R
[51] Int. Cl.² ...................................... H03H 11/00
[58] Field of Search ............... 323/6, 7, 44 R, 57, 323/60, 74; 324/127; 328/162; 333/12, 24 R, 76, 77, 78, 80 R, 81 R

[56] References Cited

UNITED STATES PATENTS

| | | | |
|---|---|---|---|
| 3,708,744 | 1/1973 | Stephens et al. | 323/60 |
| 3,760,198 | 9/1973 | Mori et al. | 328/162 X |
| 3,815,012 | 6/1974 | Milkovic | 323/6 |
| 3,832,654 | 8/1974 | Kiko | 333/80 R |

*Primary Examiner*—A. D. Pellinen
*Attorney, Agent, or Firm*—Richard A. Wise; Oistein J. Bratlie; Donald E. Mahoney

[57] ABSTRACT

A transformer circuit is arranged to attenuate spurious signals at undesired frequencies and substantially reduce the distortion of signals coupled through the transformer. The transformer circuit includes an iron core transformer and an active circuit arranged to simulate a lumped element having a frequency dependent magnitude which resonates with the transformer impedance at a desired frequency.

4 Claims, 2 Drawing Figures

TRANSFORMER CIRCUIT

BACKGROUND OF THE INVENTION

1. Field of the Invention

This invention relates generally to circuits employing transformers as a circuit element and more particularly to transformer circuits arranged to improve the signal-to-noise ratio of an output signal.

2. Description of the Prior Art

A transformer is a device comprising a winding with a tap or taps, or two or more coupled windings, with or without a magnetic core, for introducing mutual coupling between electric circuits. In the prior art, transformers are commonly used to provide an impedance transformation, voltage and current transformations, and to isolate one section of a circuit from undesired influences produced in other sections of the circuit. In communication networks, it is desirable to utilize iron or ferrite cores having magnetic properties for reducing transformer size and stray flux. However, most magnetic core transformers produce a frequency dependent or nonlinear magnetizing current conducted through a frequency dependent or nonlinear magnetizing inductance causing a distortion of the output signal and the generation of signals at undesired frequencies. Transformer circuits such as that described in the U.S. Pat. No. 3,881,149 utilize an active compensation circuit to provide a negative inductance for cancelling the transformer magnetizing inductance to linearize the response of iron core transformers as a function of frequency, as a function of current, or as a function of both frequency and current. However, spurious signals at undesired frequencies from an external source may still be conducted by the compensated transformer circuit to a load.

It is therefore desirable to arrange a transformer circuit including a transformer having a magnetic core and an active circuit to compensate for transformer core losses and the nonlinearities in the response of the transformer circuit due to the utilization of transformer magnetic cores exhibiting nonlinear current characteristics. In addition, the transformer circuit should attenuate spurious signal at undesired frequencies.

SUMMARY OF THE INVENTION

A transformer circuit is arranged to attenuate signals at undesired frequencies. The transformer circuit has a magnetic core with primary windings having first and second terminals and secondary windings having first and second terminals disposed on the core and presenting a complex impedance at the terminals of the secondary windings. Impedance simulating means is coupled to the terminals of the secondary windings for simulating a lumped-parameter element having a frequency dependent magnitude selected to resonate at a predetermined frequency with the transformer impedance at the secondary windings.

DESCRIPTION OF THE PREFERRED EMBODIMENT

Figure 1:
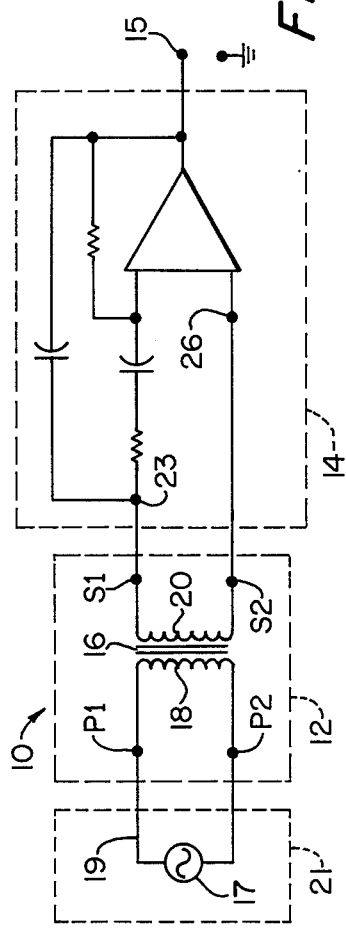
FIG. 1 is a schematic diagram of a transformer circuit arranged according to the invention.

Referring to FIG. 1, there is shown a transformer circuit 10 comprising a transformer 12 and an impedance simulating means 14. The transformer circuit 10 is arranged to respond to a multifrequency alternating current (AC) input signal to provide a narrow band AC output signal having an improved signal-to-noise ratio. The output signal is coupled to a load, not shown, connected to an output terminal 15. In this specification, the signal-to-noise ratio of an output signal at the output terminal 15 is defined as the ratio of the magnitude of the output signal at a desired frequency to the magnitude of interference or noise at undesired frequencies. The transformer 12 comprises a suitable magnetic core 16 around which are disposed a primary winding 18 and a secondary winding 20. A source 21 for the AC input signal is coupled across terminals $P_1$ and $P_2$ on the primary winding 18. The source 21 may include a 60 cycle AC signal generator 17 and a transmission line 19 susceptible to coupling spurious signals at undesired frequencies from external sources to the transformer circuit 10. The impedance simulating means 14 has a summing or first terminal 23 coupled to a secondary winding terminal $S_1$, and a second terminal 26 coupled to a secondary winding terminal $S_2$. The transformer 12 is arranged, as known in the prior art, to transfer energy from the primary terminals $P_1$ and $P_2$ to the secondary terminals $S_1$ and $S_2$ and the impedance simulating means 14 coupled thereto. An example of the magnetic core 16 is an iron core fabricated from laminated silicon steel or other ferromagnetic material. Iron cores are commonly used in communication transformers for the audio range of frequencies. However, the use of a iron core in an transformer introduces core losses which may limit the operation of a circuit employing such a transformer. In addition, most transformer iron cores provide a magnetizing inductance which is a non-linear function of frequency. The non-linear magnetizing inductance causes distortion of signals conducted through an iron core transformer and thus the generation of troublesome signals at undesired harmonic frequencies. It is therefore desirable to arrange the impedance simulating means 14 to compensate for the transformer core losses and to cooperate with the transformer 12 to attenuate signals at undesired frequencies in order to improve the signal-to-noise ratio of the output signal from the circuit 10.

Figure 2:
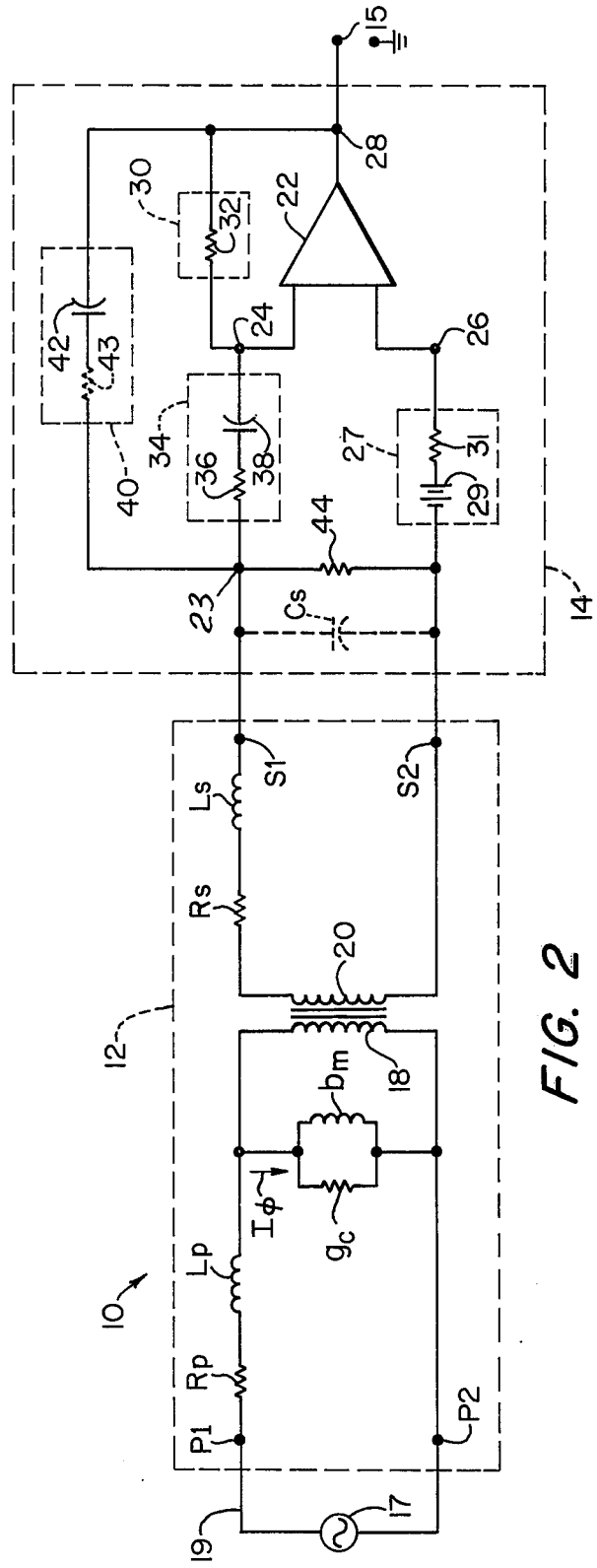
FIG. 2 is a schematic diagram of a transformer equivalent circuit and an active circuit arranged according to the invention.

Referring to FIG 2, there is shown an equivalent circuit for transformer 12 comprising lumped-parameter or discrete elements arranged to approximately represent the effects of the transformer 12 as an element in circuit 10. Effective resistance and leakage inductance in the primary winding 18 are respectively represented by a resistor $R_P$ serially connected to in inductor $L_p$. Effective resistance and leakage inductance in the secondary winding 20 are respectively represented by a resistor $R_s$ serially connected to an inductor $L_s$. Core loss and magnetizing inductance are respectively represented by a core loss conductance $g_c$ and a magnetizing inductive susceptance $b_m$ coupled in shunt across the primary winding 18. The core loss conductance, $g_c$, and the inductive susceptance $b_m$ form a magnetizing branch circuit providing a conductive path for a frequency dependent component of current, $I \phi$.

The signal-to-noise ratio of the output signal and the signal distorting effect of the magnetizing impedance of the transformer 12 at a desired frequency is improved by arranging the impedance simulating means 14 to simulate lumped-parameter or discrete elements forming an impedance having a component which resonates with the impedance presented by the transformer 12 at terminals $S_1$ and $S_2$. The impedance simulating means 14 is also arranged to compensate for the power dissipated by the core loss conductance $g_c$ and the winding resistors $R_p$ and $R_s$. Unlike lumped-parameter elements provided by prior art impedance simulators, the magnitude of the lumped-parameter elements provided by the impedance simulator 14 is frequency dependent so that the 3 db bandwidth of the circuit 10 is relatively small and the circuit 10 selectivity or attenuation of signals at undesired frequencies relative to the attenuation of signals at the resonant frequency is high. As a result, the combination of the transformer 12 and the impedance simulating means 14 responds to a multifrequency AC input signal to provide a narrow band AC output signal having an improved signal-to-noise ratio. Thus, circuit 10 is arranged to have a high loaded and unloaded Q for attenuating spurious high frequency input signals, compensating for circuit losses and improving the signal-to-noise ratio of an output signal from the transformer circuit 10.

It has been determined that the operating bandwidth of the transformer circuit 10 is reduced by arranging the impedance simulating means 14 to simulate the presence of a capacitor, $C_s$, having a frequency dependent magnitude coupled across the secondary terminals $S_1$ and $S_2$. The magnitude of the simulated capacitor, $C_s$, is selected to resonate with the impedance presented by the transformer 12 across the secondary terminals $S_1$ and $S_2$. Thus, the transformer circuit 10 is arranged to substantially eliminate the signal distorting effect of the magnetizing inductance and to provide minimum attenuation of signals at the resonant frequency and maximum attenuation for spurious signals at undesired frequencies. As a result of resonating the simulated capacitor, $C_s$, with the impedance of the transformer 12, the transformer circuit 10 approximates the frequency response of a single tuned circuit. However, since the magnitude of the simulated capacitor, $C_s$, is frequency dependent, it will be appreciated that the selectivity provided by the transformer circuit 10 exceeds the selectivity provided by a prior art single tuned circuit.

An example of the impedance simulating means 14 include an operational amplifier 22 having an inverting input terminal 24, a non-inverting input terminal 26, and an output terminal 28. A first feedback circuit 30 comprising a resistor 32 is coupled between the amplifier output terminal 28 and the amplifier inverting input terminal 24. The output terminal 28 of the operational amplifier 22 is connected to the output terminal 15 of the transformer circuit 10. A second feedback circuit 34 comprising a serial connection of a resistor 36 to a capacitor 38 is serially coupled between the summing terminal 23 and the amplifier inverting input terminal 24. A third feedback circuit 40 comprising a capacitor 42 is connected between the amplifier output terminal 28 and the summing terminal 23. An equivalent circuit for the capacitor 42 may include a series lead resistor 43 connected between the capacitor 42 and summing terminal 23. An amplifier 22 bias circuit 27 comprising a DC source 29 and a resistor 31 may be serially connected between the amplifier terminal 26 and the transformer terminal $S_2$. As stated above in reference to FIG. 1, the summing terminal 23 is connected to the secondary terminal $S_1$. A resistor 44 is coupled across the terminals $S_1$ and $S_2$ of the secondary winding 20 to minimize the effect of variations in transformer core losses on the operation of the amplifier 22 and to prevent the amplifier 22 from oscillating. The resistance of resistor 44 is selected to be substantially less than the effective resistance of the complex impedance provided by the transformer 12 across the terminals $S_1$ and $S_2$.

Under operating conditions, the operational amplifier 22 is arranged to provide a signal gain, A, at the circuit 10 resonant frequency. The signal gain A is proportional to the ratio of the impedance of the first feedback circuit 30 to the impedance of the second feedback circuit 34. In the prior art, operational amplifiers usually have first and second resistive feedback circuits arranged to provide a uniform or flat signal gain, $A_1$, over a relatively wide frequency range. Unlike prior art operational amplifiers, the operational amplifier 22 is arranged to provide a non-uniform or sloping signal gain, A, over a relatively wide frequency range so that the magnitude of the lumped elements provided by the impedance generating means 14 is frequency dependent. It has been determined that the gain, A, of the operational amplifier increases with increasing frequency when the second feedback circuit 34 includes the capacitor 38 serially connected to the resistor 36.

The presence of the simulated capacitor $C_s$ coupled across the terminals $S_1$ and $S_2$ is provided by the third feedback circuit 40 in combination with the operational amplifier 22 arranged to have a signal gain A. The magnitude of the simulated capacitor $C_s$ is directly proportional to the product of the relatively fixed capacitance of the capacitor 42 and the amplifier gain A. Thus, as the gain A of the amplifier 22 increases with increasing frequency, the magnitude of the simulated capacitor $C_s$ increases proportionately. It is apparent then that the transformer 12 and impedance simulating means 14 become antiresonant at relatively small deviations from the desired resonant frequency and signals at undesired frequencies are accordingly attenuated.

A transformer circuit according to the above technique has been designed and built to resonate at 60 Hz and provide an output signal having a −6 db bandwidth from 54 and 67 Hz and an improved signal-to-noise ratio of substantially 9 db relative to the signal-to-noise ratio of a single tuned circuit having a capacitor with a fixed magnitude. The following table represents typical values for the components of such an amplifier circuit embodying the invention.

TABLE

| | |
|---|---|
| Transformer 12 | 2100 turns 42 gauge wire disposed on a square stack of EI-187 silicon steel laminations. |
| Resistor 32 | 500 kilo ohm |
| Resistor 36 | 8.2 kilo ohm |
| Resistor 44 | 3.6 kilo ohm |
| Capacitor 38 | 0.35 micro-farad |
| Capacitor 42 | 0.09 micro-farad |
| Operational Amplifier 22 | LM 3900 quad amplifier manufactured by National Semiconductor Corporation |
| Bias resistor 27 | 1 meg ohm |

A new approach to improving the signal-to-noise ratio of an output signal from a transformer circuit has been demonstrated. The technique does not limit itself to an iron core transformer having a magnetizing inductance. The signal-to-noise ratio of a signal conducted through other devices having a shunt magnetizing inductance, such as a reactor, can be improved by resonating the device impedance with the impedance presented by an impedance simulating device as described below.

A preferred embodiment of the invention including an iron core transformer and an operational amplifier has been shown and described. Various other embodiments and modifications thereof will be apparent to those skilled in the art, and will fall within the scope of the invention as defined in the following claims.

What is claimed as new and desired to be secured by Letters Patent of the United States is:

1. A transformer circuit comprising:
a transformer having a magnetic core with primary windings having first and second terminals and secondary windings having first and second terminals disposed on said core and presenting a complex impedance at said terminals of said secondary windings; and
impedance simulating means coupled to said terminals of said secondary windings for simulating a discrete element having a frequency dependent magnitude selected to resonate at a predetermined frequency with said transformer impedance at said secondary windings, whereby said transformer circuit attenuates signals at undesired frequencies.

2. A transformer circuit in accordance with claim 1, wherein said impedance simulating means includes means for simulating a capacitor having a frequency dependent magnitude coupled across said first and second secondary winding terminals and means for providing a gain for signals conducted through said transformer.

3. A transformer circuit in accordance with claim 2, wherein said signal gain increases with increasing frequency.

4. A transformer circuit in accordance with claim 1, wherein said impedance simulating means includes an operational amplifier having an inverting input terminal, a non-inverting input terminal coupled to said first terminal of said secondary winding, a summing terminal coupled to said second terminal of said secondary winding, and an output terminal, a first feedback impedance including a resistor coupled between said output terminal and said inverting input terminal, a second feedback impedance including a serial connection of a resistor and capacitor coupled between said summing terminal and said inverting input terminal, a third feedback impedance including a capacitor coupled between said output terminal and said summing terminal.

* * * * *